United States Patent Office 3,668,003

Patented June 6, 1972

3,668,003

PRINTED CIRCUITS

Ralph William Furness, Ealing, London, England, assignor to Cirkitrite Limited

No Drawing. Filed Nov. 26, 1969, Ser. No. 880,362
Int. Cl. C23c 3/02
U.S. Cl. 117—212 10 Claims

ABSTRACT OF THE DISCLOSURE

A method is provided for forming a conductive pattern on a printed circuit board. A non-conductive substrate is first sensitized over an entire region and an activating agent is applied as a pattern within the sensitized region. The activated substrate is then immersed in an electroless plating solution to deposit a metal layer on the activated pattern. A heavier layer of metal may then be applied to the conductive pattern by an electrolytic process.

This invention relates to printed circuits and like conductive patterns and particularly to an improved method of forming a printed circuit or like conductive pattern on a non-conductive substrate.

The invention is particularly intended for the formation of a printed circuit on a substrate of an inert plastics material.

It is known that electric non-conductors, such as plastics, are not receptive to direct metal electro-plating and accordingly the formation of a printed circuit of like conductive pattern on a substrate of an inert plastics material requires special preparation of the surface in order that it be receptive to the deposition of a metallic conductor.

Presently available methods of forming printed circuits on plastics substrates involve to some degree a subtractive technique. For example, it is known to use an insulating base material clad with copper foil and to print thereon, using an etchant-resistant ink, a positive image of the desired circuit pattern. The exposed foil is dissolved in an etchant in the usual way. It is known that such a technique is not very convenient.

It is also known to form for example a conductive nickel-boron plate over the entire surface of the substrate by sensitising or keying the base material, applying over the entire sensitised surface an activating agent, which normally comprises a solution of ions of a noble metal, and forming over the entire activated surface an electrically conductive coat of nickel or copper by electroless plating. This latter step normally consists of applying a solution of ions or an appropriate conductor such as nickel or copper in the presence of a reducing agent. Subsequently an acid-resistant ink is printed on the conductive layer; copper or nickel is then electroplated from an acid bath; this step is followed by the removal of the ink and the removal of the excess nickel-boron that had been previously protected by the ink.

Even this method involves in part the removal of part of the conductive layer and is thus in part a subtractive process.

The present invention concerns a wholly additive process for making a conductive pattern or planar electric circuit (referred to herein as "printed" circuit for convenience even though, as will be explained, the use of a printing ink as an etchant-resistant is unnecessary). I have found that the formation of a conductive layer over the entire substrate and the etching thereof in accord with the desired conductive pattern is unnecessary. Instead, after the substrate is sensitised or keyed with a suitable, well known agent, the activating agent which is essentially an agent catalytically effective to reduce ions of a metallic conductor to the metal, may be selectively deposited on the sensitised substrate in accord with the desired circuit pattern. Subsequently, at least the selectively activated areas of the substrate can be subjected to electroless plating to for the desired conductive layer.

The selective deposition of the activating agent can be carried out in a number of different ways. It is possible for example to paint the activating agent on the sensitised surface using a brush or a felt pen; a printing block might be used. The selection of activator is determined by the substrate used and the metal to be deposited.

The method is particularly appropriate for applying conductive patterns to irregularly shaped objects as well as to plane surfaces. The application of printed circuits to large or irregular objects has hitherto always presented considerable problems which can be substantially reduced with the present invention. The invention is applicable also to circuits employing a flexible substrate. Conventional methods of making printed circuits require that there be a very good bond between the conductive layer that is selectively etched and the substrate and where the substrate is flexible the conductive layer will tend to crack if the adhesion between it and the substrate is high. This has greatly complicated the application of printed circuits to flexible substrates in the past but again such problems can be substantially reduced according to the present invention.

The sensitising agent can be any suitable agent commonly employed for similar purposes in electroless plating; it is for example convenient to employ an acidic solution of stannous chloride on certain materials.

The activating agent is as briefly mentioned hitherto essentially a catalyst for the reduction of ions of a conductive metal, normally nickel or copper, to the metal. Normally, the catalyst comprises a noble metal which can be applied as an ionic solution to the sensitised surface. The reduced metal can be auto-catalytic to reduce other metals, or can be such that it will receive further catalysts to accept the deposit of other metals without affecting the untreated areas. The choice of catalyst depends to a certain extent on the metal that is to be electrolessly plated to form the "printed" circuit. Palladium, commonly in the form of palladium chloride, is suitable in most circumstances. Although silver is not particularly suitable if nickel is the conductive metal, it is satisfactory if the plating is to be of copper. The silver can be in the form of a solution of silver nitrate in the presence of ammonium ions.

The electroless plating solution may likewise comprise any suitable solution commonly employed for this purpose. Its essential function is to reduce ions of the metallic conductor to metal on the catalytically effective surface of the substrate. The solution normally comprises a solution of a salt of the metal in the presence of a reducing agent. After the formation of a metal layer from the electroless solution, a further deposition of metal thereon may be made by an electrolytic process. This technique is particularly suitable in instances where a greater thickness of metal deposit is required.

EXAMPLE

In one example of the invention, the formation of a printed circuit on an inert plastics substrate may proceed as follows:

(1) At least those parts of the substrate that are to carry the conductive parts of the printed circuit, and preferably all the surface of the substrate, is sensitised by the application of a solution containing 10 g. of stannous chloride and 40 ml. of normal hydrochloric acid per litre of distilled water. This surface can now be rinsed, dried and stored indefinitely to permit the writing or printing of the activator selectively with a high degree of precision.

(2) An activator is applied selectively to the sensitised surface in accord with the desired configuration of the printed circuit. An appropriate activator contains between 10 and 20 g. of silver nitrate and 20 to 30 ml. of 0.880 ammonia per litre of distilled water. The activator may be painted on to the sensitised surface using a felt pen, paint brush or similar means.

(3) At least the activated surface of the substrate and preferably all the substrate is immersed in an electroless plating bath. The bath may contain a Fehlings solution which for example may consist of 10 g. of copper sulphate, 10 g. of sodium hydroxide and 50 g. of sodium potassium tartrate per litre of distilled water, together with 10 ml. of formaldehyde (37–41% w./v.) per litre of solution.

(4) The plated substrate after treatment in the electroless plating bath is washed and dried.

(5) This deposited surface of copper can be controlled by time and temperature and Ph. adjustment to deposit controlled thicknesses of metal.

It can be further activated by immersion in a weak solution of palladium chloride to accept deposition of electroless nickel. Since the selected areas are now coated with a metal, these surfaces are capable of accepting a wide range of other metals by well known immersion processes such as cadmium, gold, lead, silver, ruthenium, rhodium, platinum, tin etc., without depositing on the non-coated areas. They can also be further electroplated by using well kown selective plating processes such as the "Dallic" process, or where the pattern is continuous, normal electroplating techniques can be used.

It is also possible to disperse the catalyst with other ingredients to facilitate printing. For example, an addition of 10% polyvinyl alcohol will form an emulsion to give a binding medium suitable for transfer printing.

What I claim is:

1. An additive process for forming a printed circuit board having a desired conductive pattern comprehended within a given region on a non-conductive substrate comprising the steps of:

(a) applying a sensitizing agent to a surface of said substrate over the entire area of said region to establish a sensitized substrate;

(b) selectively applying an activating agent to said sensitized surface within said region in a pattern that matches said desired conductive pattern;

(c) immersing at least said region in an electroless plating solution for causing a metallic layer to be deposited on the pattern defined by said activating agent to establish said desired conductive pattern.

2. The process of claim 1 including the further step of depositing a heavier layer of metal of said conductive pattern by means of an electrolytic process.

3. The process of claim 1 wherein the sensitizing and activating agents, and the electroless plating solution are such as to establish the conductive pattern in copper.

4. The process of claim 1 including the further steps of applying at least over said metallic layer, further sensitizing agent of palladium chloride, and then immersing said sensitized substrate in an electroless nickel plating solution.

5. The process of claim 1 wherein said activating agent is in the form of an emulsion, and is applied by a transfer printing operation.

6. The process of claim 1 wherein said activating agent is applied by means of a felt pen.

7. The process of claim 1 wherein said sensitizing agent is an acidic solution of stannous chloride.

8. The process of claim 7 wherein said activating agent is a solution of a salt of a noble metal.

9. The process of claim 8 wherein the last mentioned solution comprises silver nitrate and ammonia.

10. The process of claim 1 wherein said electroless plating solution comprises a Fehlings solution and formaldehyde.

References Cited

UNITED STATES PATENTS

| | | | |
|---|---|---|---|
| 3,415,679 | 12/1968 | Chass | 117—212 |
| 3,392,053 | 7/1968 | Olson et al. | 117—212 |
| 3,349,408 | 10/1967 | Gillen et al. | 117—154 X |
| 3,259,559 | 7/1966 | Schneble, Jr. et al. | 117—212 X |
| 3,075,855 | 1/1963 | Agens | 171—212 X |
| 3,443,988 | 5/1969 | McCormack | 117—212 |
| 3,032,443 | 5/1962 | Short | 117—212 |

RALPH S. KENDALL, Primary Examiner

U.S. Cl. X.R.

117—213, 227, 47 A, 160, 38

UNITED STATES PATENT OFFICE

CERTIFICATE OF CORRECTION

Patent No. 3,668,003 Dated June 6, 1972

Inventor(s) Ralph William Furness

It is certified that error appears in the above-identified patent and that said Letters Patent are hereby corrected as shown below:

Column 3, line 32, "kown" should be --known--.

Column 4, line 15, before "further", insert --a--.

Signed and sealed this 7th day of November 1972.

(SEAL)
Attest:

EDWARD M.FLETCHER,JR.
Attesting Officer

ROBERT GOTTSCHALK
Commissioner of Patents